United States Patent
Choi et al.

(10) Patent No.: US 9,853,111 B2
(45) Date of Patent: Dec. 26, 2017

(54) METHOD OF MANUFACTURING A SEMICONDUCTOR DEVICE

(71) Applicant: Samsung Electronics Co., Ltd., Suwon-si, Gyeonggi-do (KR)

(72) Inventors: Kyung In Choi, Seoul (KR); Bon Young Koo, Suwon-si (KR); Hyun Gi Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 39 days.

(21) Appl. No.: 15/174,412

(22) Filed: Jun. 6, 2016

(65) Prior Publication Data
US 2016/0359008 A1    Dec. 8, 2016

(30) Foreign Application Priority Data
Jun. 8, 2015 (KR) .................. 10-2015-0080620

(51) Int. Cl.
*H01L 29/417* (2006.01)
*H01L 29/66* (2006.01)
(Continued)

(52) U.S. Cl.
CPC .. *H01L 29/41791* (2013.01); *H01L 21/31111* (2013.01); *H01L 21/31116* (2013.01); *H01L 21/31155* (2013.01); *H01L 21/76825* (2013.01); *H01L 21/76897* (2013.01); *H01L 29/0847* (2013.01); *H01L 29/401* (2013.01);
(Continued)

(58) Field of Classification Search
CPC ........... H01L 21/823821; H01L 21/845; H01L 29/66545; H01L 29/66795; H01L 29/7848; H01L 29/785; H01L 21/30604; H01L 29/7856; H01L 27/0886; H01L 27/1211; H01L 29/6681; H01L 2029/7858; H01L 21/31155; H01L 21/76897; H01L 29/401;
(Continued)

(56) References Cited

U.S. PATENT DOCUMENTS 7,691,741 B2   4/2010 Lee
8,703,556 B2   4/2014 Kelly et al.
(Continued)

FOREIGN PATENT DOCUMENTS

JP   5578454 B2   8/2014
JP   5614877 B2   10/2014
(Continued)

*Primary Examiner* — Bac Au
(74) *Attorney, Agent, or Firm* — Myers Bigel, P.A.

(57) ABSTRACT

A method of manufacturing a semiconductor device includes forming active fins on a substrate; forming source/drain regions on the active fins on both sides of a gate structure, the gate structure extending in a direction intersecting with a direction in which the active fins extend; forming an etch stop layer on the source/drain regions; forming an interlayer dielectric layer on the etch stop layer; forming a first opening by partially removing the interlayer dielectric layer so as not to expose the etch stop layer; forming an impurity region within the interlayer dielectric layer by implanting a first impurity ion through the first opening; forming a second opening by removing the impurity region so as to expose the etch stop layer; implanting a second impurity ion into the exposed etch stop layer; and removing the exposed etch stop layer.

20 Claims, 31 Drawing Sheets

(51) Int. Cl.
*H01L 21/3115* (2006.01)
*H01L 21/311* (2006.01)
*H01L 29/08* (2006.01)
*H01L 29/40* (2006.01)
*H01L 21/768* (2006.01)
*H01L 29/78* (2006.01)

(52) U.S. Cl.
CPC ...... *H01L 29/66795* (2013.01); *H01L 29/785* (2013.01); *H01L 2029/7858* (2013.01)

(58) Field of Classification Search
CPC ....... H01L 29/41791; H01L 21/823431; H01L 29/66636
See application file for complete search history.

(56) References Cited

U.S. PATENT DOCUMENTS

| | | | |
|---|---|---|---|
| 8,906,768 B2 | 12/2014 | Wong et al. | |
| 9,406,804 B2* | 8/2016 | Huang | H01L 29/7853 |
| 9,490,348 B2* | 11/2016 | Ching | H01L 29/7856 |
| 9,496,402 B2* | 11/2016 | Fang | H01L 29/7851 |
| 9,530,871 B1* | 12/2016 | Tsai | H01L 21/76829 |
| 2011/0147840 A1 | 6/2011 | Cea et al. | |
| 2011/0147858 A1 | 6/2011 | Lim et al. | |
| 2011/0215371 A1 | 9/2011 | Tang | |
| 2011/0294278 A1 | 12/2011 | Eguchi et al. | |
| 2013/0334614 A1 | 12/2013 | Liaw | |
| 2014/0001520 A1* | 1/2014 | Glass | H01L 29/66439 257/288 |
| 2014/0077146 A1 | 3/2014 | Kakoschke et al. | |
| 2014/0217517 A1 | 8/2014 | Cai et al. | |
| 2014/0256094 A1 | 9/2014 | Lin et al. | |
| 2014/0273365 A1 | 9/2014 | Wei et al. | |
| 2015/0270401 A1* | 9/2015 | Huang | H01L 29/7851 257/192 |
| 2017/0098711 A1* | 4/2017 | Hsiao | H01L 29/7856 |
| 2017/0222000 A1* | 8/2017 | Chi | H01L 29/408 257/386 |
| 2017/0250266 A1* | 8/2017 | Huang | H01L 29/66795 |

FOREIGN PATENT DOCUMENTS

| | | |
|---|---|---|
| KR | 10-1218479 B1 | 1/2013 |
| KR | 10-1441747 B1 | 9/2014 |

\* cited by examiner

METHOD OF MANUFACTURING A SEMICONDUCTOR DEVICE

CROSS-REFERENCE TO RELATED APPLICATION

This application claims priority under 35 U.S.C. §119 to Korean Patent Application No. 10-2015-0080620 filed on Jun. 8, 2015, with the Korean Intellectual Property Office, the disclosure of which is incorporated herein by reference.

BACKGROUND

Example embodiments of the present inventive concept relate to a method of manufacturing a semiconductor device.

As demands for high-functionalization and multifunctionalization of semiconductor devices as well as an increase in the speed thereof have increased, the degree of integration of the semiconductor devices has increased. In manufacturing semiconductor devices having fine patterns in accordance with the trend towards a high degree of integration of the semiconductor devices, it may be necessary to implement patterns having fine widths or fine clearances. In addition, to overcome limitations of device characteristics of a planar metal-oxide-semiconductor FET (MOSFET), efforts to develop semiconductor devices including a fin field effect transistor (FinFET) and having a three-dimensional structure of a channel have been ongoing.

SUMMARY

Example embodiments of the present inventive concept may provide a method of manufacturing a semiconductor device having improvements in a degree of integration and reliability.

According to an example embodiment of the present inventive concept, a method of manufacturing a semiconductor device may include: forming active fins on a substrate; forming source/drain regions on the active fins on both sides of a gate structure, the gate structure extending in a direction intersecting with a direction in which the active fins extend; forming an etch stop layer on the source/drain regions; forming an interlayer dielectric layer on the etch stop layer; forming a first opening by partially removing the interlayer dielectric layer so as not to expose the etch stop layer; forming an impurity region within the interlayer dielectric layer by implanting a first impurity ion through the first opening; forming a second opening by removing the impurity region so as to expose the etch stop layer; implanting a second impurity ion into the exposed etch stop layer; and removing the exposed etch stop layer.

In the forming of the impurity region, the first impurity ion may be implanted into the etch stop layer.

The forming of the second opening may be performed by a wet etching process.

An etch rate of the impurity region may be greater than an etch rate of the interlayer dielectric layer.

In the wet etching process, an acid solution may be used as an etchant.

The second opening may have a width smaller than a length of a straight line connecting both ends of the source/drain regions in the direction in which the gate electrode extends.

In the forming of the source/drain regions, upper surfaces of the source/drain regions may have a corrugated shape, and after the removal of the etch stop layer, the upper surfaces of the source/drain regions may be maintained to have the corrugated shape.

The removal of the etch stop layer may be performed by a dry etching process.

The dry etching process may be an anisotropic dry etching process.

In the anisotropic dry etching process, a gas including $Cl_2$, $CHF_3$, $CF_4$, or combinations thereof may be used as an etching gas.

The dry etching process may be an isotropic dry etching process.

In the isotropic dry etching process, a gas including $NH_3$ or $NF_3$ gas may be used as an etching gas.

The first and second impurity ions may contain at least one ion of $BF_3$, B, C, N, O, F, Si, Ge, As, P, Ar, Ga, H or the like.

At least one of the first and second impurity ions may be implanted into a portion of the source/drain regions.

The etch stop layer may be formed of a silicon nitride.

According to an example embodiment of the present inventive concept, a method of manufacturing a semiconductor device may include: forming active fins on a substrate; forming source/drain regions on the active fins on both sides of a gate structure, the gate structure extending in a direction intersecting with a direction in which the active fins extend; forming an etch stop layer on the source/drain regions; forming an interlayer dielectric layer on the etch stop layer; forming a first opening by partially removing the interlayer dielectric layer so as not to expose the etch stop layer; forming an impurity region within the interlayer dielectric layer by implanting a first impurity ion through the first opening; forming a second opening by removing the impurity region so as to expose the etch stop layer; forming a contact plug insulating layer on a side surface of the second opening and the exposed etch stop layer; implanting a second impurity ion into the etch stop layer and the contact plug insulating layer through the second opening; and removing the etch stop layer and the contact plug insulating layer into which the second impurity ion is implanted.

The removal of the etch stop layer and the contact plug insulating layer may be performed by a dry etching process.

In the dry etching process, a gas including $NH_3$ or $NF_3$ gas may be used as an etching gas.

In the dry etching process, a gas including $Cl_2$, $CHF_3$, $CF_4$, or combinations thereof may be used as an etching gas.

The etch stop layer and the contact plug insulating layer may each be formed of silicon nitride, and the first and second impurity ions may contain at least one ion of $BF_3$, B, C, N, O, F, Si, Ge, As, P, Ar, Ga, H or the like.

According to an example embodiment of the present inventive concept, a method of manufacturing a semiconductor device may include: forming active fins on a substrate; forming source/drain regions on the active fins on both sides of a gate structure, the gate structure extending in a direction intersecting with a direction in which the active fins extend; forming an etch stop layer on the source/drain regions; forming an interlayer dielectric layer on the etch stop layer; forming a first opening by partially removing the interlayer dielectric layer so as not to expose the etch stop layer; implanting an impurity ion into the interlayer dielectric layer and the etch stop layer through the first opening; and removing the interlayer dielectric layer and the etch stop layer into which the impurity ion is implanted.

The removal of the etch stop layer may be performed by a dry etching process.

The etch stop layer may be formed of a silicon nitride, and the impurity ion may contain at least one ion of $BF_3$, B, C, N, O, F, Si, Ge, As, P, Ar, Ga, H or the like.

According to an example embodiment of the present inventive concept, a method of manufacturing a semiconductor device may include: forming active fins on a substrate; forming source/drain regions on the active fins on both sides of a gate structure, the gate structure extending in a direction intersecting with a direction in which the active fins extend; forming an etch stop layer on the source/drain regions; forming an interlayer dielectric layer on the etch stop layer; forming an opening by partially removing the interlayer dielectric layer so as to expose the etch stop layer; implanting an impurity ion into an upper surface of the etch stop layer exposed through the opening; and removing the exposed etch stop layer.

It is noted that aspects described with respect to one embodiment may be incorporated in different embodiments although not specifically described relative thereto. That is, all embodiments and/or features of any embodiments can be combined in any way and/or combination. Moreover, other methods, systems, articles of manufacture, and/or devices according to embodiments of the inventive subject matter will be or become apparent to one with skill in the art upon review of the following drawings and detailed description. It is intended that all such additional systems, methods, articles of manufacture, and/or devices be included within this description, be within the scope of the present inventive subject matter, and be protected by the accompanying claims. It is further intended that all embodiments disclosed herein can be implemented separately or combined in any way and/or combination.

BRIEF DESCRIPTION OF DRAWINGS

The above and other aspects, features and advantages of the present inventive concept will be more clearly understood from the following detailed description taken in conjunction with the accompanying drawings, in which.

DETAILED DESCRIPTION

Figure 1:
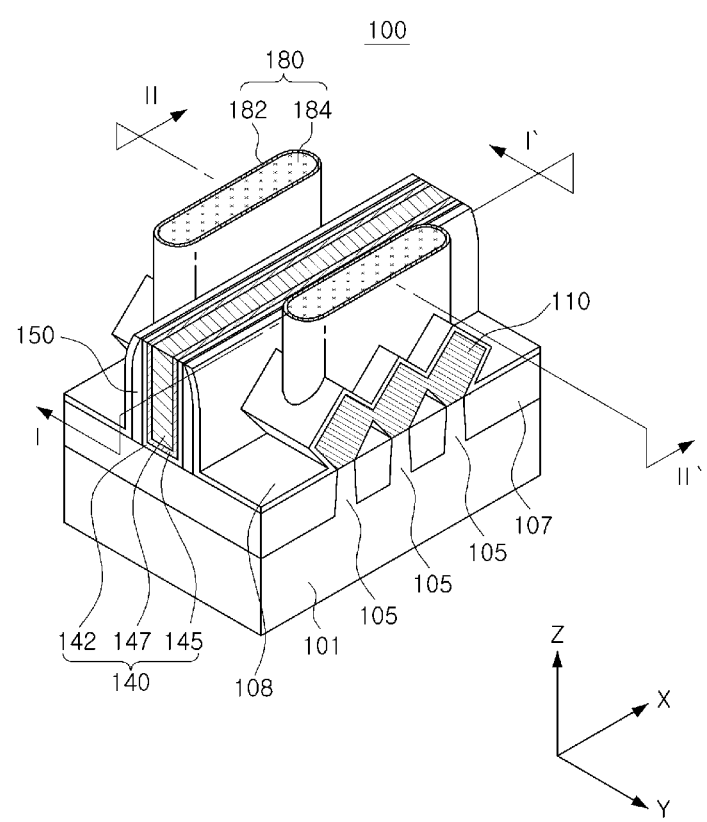
FIG. 1 is a perspective view of a semiconductor device according to an example embodiment of the present inventive concept.

The inventive concept may be embodied in various different forms, and should be construed as limited, not by the embodiments set forth herein, but only by the accompanying claims. Rather, these embodiments are provided so that this disclosure is thorough and complete and fully conveys the inventive concept to those skilled in the art. In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concept but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween.

Terms such as "top," "bottom," "upper," "lower," "above," "below," and the like are used herein to describe the relative positions of elements or features. For example, when an upper part of a drawing is referred to as a "top" and a lower part of a drawing is referred to as a "bottom" for the sake of convenience, in practice, the "top" may also be called a "bottom" and the "bottom" may also be a "top" without departing from the teachings of the inventive concept.

Furthermore, throughout this disclosure, directional terms such as "upper," "intermediate," "lower," and the like may be used herein to describe the relationship of one element or feature with another, and the inventive concept should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the inventive concept.

The terminology used herein to describe embodiments of the invention is not intended to limit the scope of the inventive concept.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
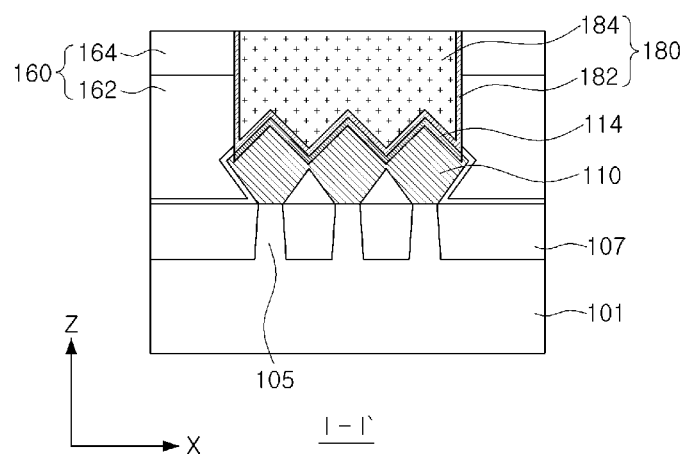
FIG. 2a and FIG. 2b are cross-sectional views of the semiconductor device of FIG. 1, taken along line I-I' and line II-II'.
Figure 2B:
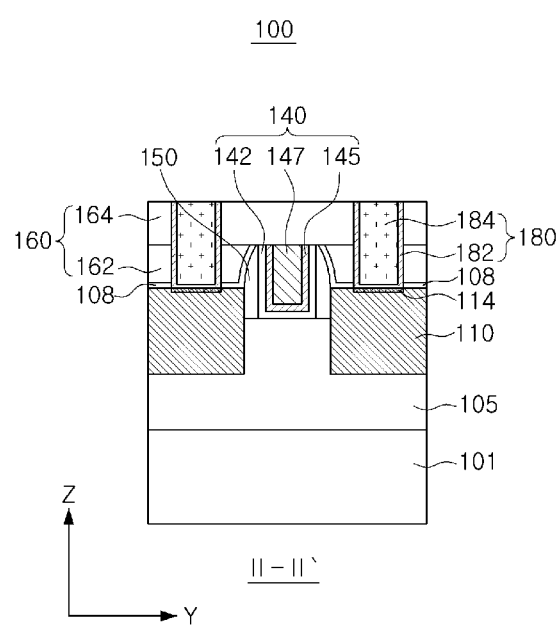

FIG. 1 is a perspective view of a semiconductor device according to an example embodiment of the present inventive concept. FIG. 2a and FIG. 2b are cross-sectional views of the semiconductor device of FIG. 1, taken along line I-I' and line II-II'. For convenience of explanation, FIG. 1 illustrates only main components and, for example, an interlayer dielectric layer 160 of FIG. 2a and FIG. 2b is omitted in FIG. 1.

Referring to FIG. 1 through FIG. 2b, a semiconductor device 100 may include a substrate 101, active fins 105, source/drain regions 110, a gate structure 140, and contact plugs 180. The semiconductor device 100 may further include device isolation layers 107, a spacer 150, an etch stop layer 108, and an interlayer dielectric layer 160.

The semiconductor device 100 according to the example embodiment may be a FinFET, which is a field effect transistor in which the active fins 105 respectively have a fin structure.

The substrate 101 may have an upper surface extended in an X-direction and a Y-direction. The substrate 101 may contain a semiconductor material, such as a group IV semiconductor, a group III-V compound semiconductor, or a group II-VI compound semiconductor. For example, the group IV semiconductor may include silicon, germanium, or silicon germanium. The substrate 101 may be provided as a bulk wafer, an epitaxial layer, a silicon-on-insulator (SOI) layer, a semiconductor-on-insulator (SEOI) layer, or the like.

The device isolation layers 107 may define the active fins 105 in the substrate 101. The device isolation layers 107 may be formed of an insulating material. The device isolation layers 107 may be formed by, for example, a shallow trench isolation (STI) process. The device isolation layers 107 may be formed of an oxide, a nitride or combinations thereof.

The active fins 105 may be defined by the device isolation layers 107 within the substrate 101 and may be disposed to extend in a first direction, for example, in the Y-direction. Each of the active fins 105 may have an active fin structure protruding from the substrate 101. The active fins 105 may be formed of a portion of the substrate 101, and alternatively, may include an epitaxial layer grown from the substrate 101. In a side surface of the gate structure 140, the active fins 105 provided on the substrate 101 may be recessed, and the source/drain regions 110 may be disposed thereon.

In both sides of the gate structure 140, the source/drain regions 110 may be disposed on the active fins 105. The source/drain regions 110 may be elevated source/drain forms in which upper surfaces thereof are disposed at a position higher than lower surfaces of the gate structure 140. In the example embodiment, the source/drain regions 110 are illustrated as having pentagonal shapes, but the source/drain regions 110 may have various shapes. For example, the source/drain regions 110 may be polygonal shapes, circular shapes, or rectangular shapes.

The source/drain regions 110 may be provided as source regions or drain regions of the semiconductor device 100. The source/drain regions 110 may have a structure in which they are connected to or merged with one another on the three active fins 105. However, the number of the active fins 105 connected to the source/drain regions 110 is not limited to that illustrated in the example embodiment. Upper surfaces of the source/drain regions 110 may have a corrugated shape.

The source/drain regions 110 may contain, for example, silicon or silicon germanium (SiGe). In particular, the source/drain regions 110 may be formed of an epitaxial layer. For example, in the case that the source/drain regions 110 contain silicon germanium (SiGe), mobility of holes may be improved by applying compressive stress to a channel region of the semiconductor device 100, which may be a region of the active fins 105 formed of silicon (Si).

A silicide layer 114 may be disposed between the source/drain regions 110 and the contact plugs 180. The silicide layer 114 may be a layer formed by silicidizing the source/drain regions 110 contacting the contact plugs 180 in some embodiments of the inventive concept. The silicide layer 114 may be formed of, for example, titanium silicide.

When the semiconductor device 100 is a p-type metal oxide semiconductor (PMOS) field effect transistor, the source/drain regions 110 may be formed of silicon germanium (SiGe) and may include a buffer region and a growth region disposed on the active fins 105.

The growth region may be grown from the buffer region, and the growth region and the buffer region may be connected to each other on the active fins 105. The growth region, together with the buffer region, may form a pentagonal shape. The growth region may have surfaces inclined with respect to the upper surface of the substrate 101. The surfaces of the growth region may be crystallographic planes and, for example, when the growth region is formed of silicon germanium (SiGe), the surface of the growth region is a (111) plane or an equivalent planes thereof.

The buffer region and the growth region may be regions containing dopant and/or elements having different concentrations. For example, the buffer region may contain a first concentration of germanium (Ge), and the growth region may contain a second concentration of germanium (Ge) higher than the first concentration.

A p-type dopant may be in-situ doped during the growth of the source/drain regions 110, or may be separately implanted after the growth of the source/drain regions 110. For example, the p-type dopant may be boron (B).

The buffer region and the growth region may contain a p-type dopant at different concentrations. The p-type dopant may be in-situ doped during the growth of the source/drain regions 110 or may be separately implanted after the growth of the source/drain regions 110. The buffer region may contain, for example, a first concentration of boron (B), and the growth region may contain a second concentration of boron (B) higher than the first concentration. The buffer region and the growth region may have different concentrations of germanium (Ge), simultaneously with different concentrations of dopant, or may have different concentrations of germanium (Ge) or dopant.

When the semiconductor device 100 is an n-type metal oxide semiconductor (NMOS) field effect transistor, the source/drain regions 110 may be grown directly from the active fins 105 without the buffer region, and may be connected to each other to form pentagonal shapes. The source/drain regions 110 may have surfaces inclined with respect to the upper surface of the substrate 101. The source/drain regions 110 may be formed of silicon (Si) and may contain an n-type dopant, such as phosphorous (P).

The gate structure 140 may be disposed in an upper portion of the active fins 105 to intersect with the active fins 105, and may include a gate insulating layer 142 and first and second gate electrodes 145 and 147.

The gate insulating layer 142 may be disposed between the active fins 105 and the gate electrodes 145 and 147. The gate insulating layer 142 may be extended between the spacers 150 and the gate electrodes 145 and 147. The gate insulating layer 142 may contain an oxide, a nitride, or a high-k dielectric material. The high-k dielectric material may refer to a dielectric material having a dielectric constant greater than that of silicon oxide ($SiO_2$). The high-k dielectric material may be at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAlO_y$), and praseodymium oxide ($Pr_2O_3$). In another embodiment, the gate insulating layer 142 may be formed only between the active fins 105 and the gate electrodes 145 and 147.

The first and second gate electrodes 145 and 147 may be sequentially formed on the gate insulating layer 142. The active fins 105 intersecting with the first and second gate electrodes 145 and 147 may be provided with a channel region. The first and second gate electrodes 145 and 147 may be formed of different materials. The first gate electrode 145 may contain a metallic nitride, such as titanium nitride (TiN), tantalum nitride (TaN), or tungsten nitride (WN). The second gate electrode 147 may contain a metal, such as aluminum (Al), tungsten (W), molybdenum (Mo), or the like, or may contain a semiconductor material, such as doped polysilicon. The first gate electrode 145 may serve as a diffusion barrier layer for the second gate electrode 147, but is not limited thereto. In another embodiment, the gate electrodes may be formed as a single layer.

The spacer 150 may be disposed on both side surfaces of the gate structure 140. The spacers 150 may insulate the source/drain regions 110 from the first and second gate electrodes 145 and 147. The spacers 150 may be formed of an oxide, a nitride, or an oxynitride, and may be formed of a multilayer structure. For example, the spacers 150 may have a structure in which a silicon nitride layer and a low-k dielectric layer are stacked.

The etch stop layer 108 may cover surfaces of the source/drain regions 110 except for a region in which the contact plugs 180 are disposed, side surfaces of the spacers 150, and upper surfaces of the device isolation layers 107. The etch stop layer 108 may be used to detect an endpoint in a case in which the interlayer dielectric layer 160 is partially etched to form the contact plugs 180. For example, the etch stop layer 108 may be a silicon nitride ($Si_3N_4$) layer. A detailed description will be provided with reference to FIG. 13 and FIG. 15.

The contact plugs 180 may be disposed on the source/drain regions 110 and may be electrically connected to other components of the semiconductor device 100 in such a manner that a signal is applied to the source/drain regions 110. The contact plugs 180 may have elongated shapes on a plane. That is, the contact plugs 180 may be formed to extend in a direction in which the gate structure 140 extends, that is, in the X-direction, and may have shapes, such as rectangular shapes, elliptical shapes, or the like.

As illustrated in FIG. 2a, a lower surface of each of the contact plugs 180 may be corrugated according to a shape of the upper surfaces of the source/drain regions 110. That is, the contact plug 180 may have a wavy lower surface. Because the contact plug 180 has a corrugated lower surface as described above, a contact area between the contact plug 180 and the source/drain regions 110 may be increased. When an opening for the formation of the contact plug 180 is formed, only the etch stop layer 108 may be selectively removed while minimizing or reducing the loss of the source/drain regions 110, whereby the corrugated lower surface of the contact plug 180 may be obtained. Such embodiments will be described in greater detail with reference to FIG. 14 through FIG. 15.

In addition, ions of an impurity (dopant) may be implanted into the source/drain regions 110 to affect a Schottky barrier, thereby lowering contact resistance of the source/drain regions 110.

The contact plug 180 may include first and second conductive layers 182 and 184. The first conductive layer 182 may serve as a diffusion barrier layer for a metal material forming the second conductive layer 184. The first conductive layer 182 may be formed along upper portions of the source/drain regions 110 and side walls of the contact plug 180. The first conductive layer 182 may contain, for example, at least one metallic nitride of titanium nitride (TiN), tantalum nitride (TaN), tungsten nitride (WN), and the like. The second conductive layer 184 may contain a conductive material, such as aluminum (Al), copper (Cu), tungsten (W), molybdenum (Mo) or the like.

The interlayer dielectric layer 160 may include first and second interlayer dielectric layers 162 and 164 and may be disposed to cover the etch stop layer 108, the contact plugs 180, and the gate structure 140. A height of the first interlayer dielectric layer 162 may be substantially identical to a height of the gate structure 140. However, the first and second interlayer dielectric layers 162 and 164 may be layers distinguished during a fabrication process, and relative heights thereof and a position of an interface therebetween are not limited to those illustrated in the drawings. In another embodiment, the first and second interlayer dielectric layers 162 and 164 may be formed of a single layer. The first and second interlayer dielectric layers 162 and 164 may be formed of an insulating material and may contain at least one of an oxide layer, a nitride layer, and an oxynitride layer. For example, the first interlayer dielectric layer 162 may be a Tonen SilaZene (TOSZ) layer, and the second interlayer dielectric layer 164 may be a Tetraethyl Ortho Silicate (TEOS) layer.

FIG. 3 through FIG. 16 are views illustrating a method of manufacturing a semiconductor device according to an example embodiment of the present inventive concept, in a process sequence. FIG. 3 through FIG. 16 are cross-sectional views illustrating respective processes taken along line I-I' of FIG. 2.

Figure 3:
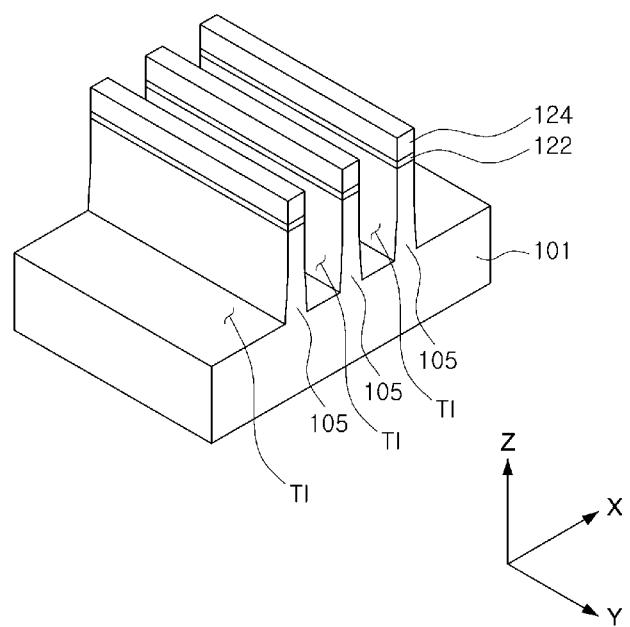
FIG. 3 through FIG. 16 are cross-sectional views illustrating respective processes of a method of manufacturing a semiconductor device according to an example embodiment of the present inventive concept.

Referring to FIG. 3, the substrate 101 may be patterned to form trenches TI defining the active fins 105.

First, a pad oxide pattern 122 and a mask pattern 124 may be formed on the substrate 101. The pad oxide pattern 122 may be a layer for protecting the upper surfaces of the active fins 105 according to some embodiments of the inventive concept. The mask pattern 124, which may be a mask layer for patterning the substrate 101, may contain a silicon nitride, a carbon-containing material, and the like. The mask pattern 124 may be formed of a multilayer structure.

The trenches TI may be formed by anisotropically etching the substrate 101 using the pad oxide pattern 122 and the mask pattern 124. Because the trenches TI may have a high aspect ratio, widths thereof may be reduced downwardly into the substrate 101, and thus the active fins 105 may have a shape narrowing upwardly away from the bottoms of the trenches TI.

Figure 4:
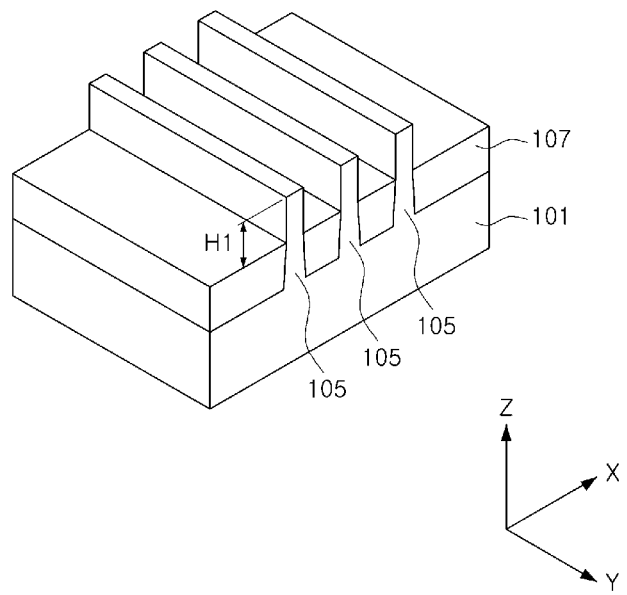

Referring to FIG. 4, the device isolation layers 107 filling the trenches TI (refer to FIG. 3) may be formed.

First, a planarization process may be performed after filling the trenches TI with an insulating material. During the planarization process, at least a portion of the pad oxide pattern 122 (refer to FIG. 3) and the mask pattern 124 (refer to FIG. 3) may be removed. In another embodiment, after a relatively thin liner layer may be first formed within the trenches TI (refer to FIG. 3), the trenches TI (refer to FIG. 3) may be filled.

Then, the insulting material filling the trenches TI (refer to FIG. 3) may be partially removed, whereby a process of protruding the active fins 105 upwardly from the device isolation layers 107 may be performed. Such a process may be performed by a wet etching process using at least one portion of the pad oxide pattern 122 (refer to FIG. 3) as an etching mask, whereby the active fins 105 may protrude upwardly by a predetermined height H1, and the protruding height H1 may be variously changed. During the etching of the insulting material, the pad oxide pattern 122 (refer to FIG. 3) may also be removed.

Figure 5:
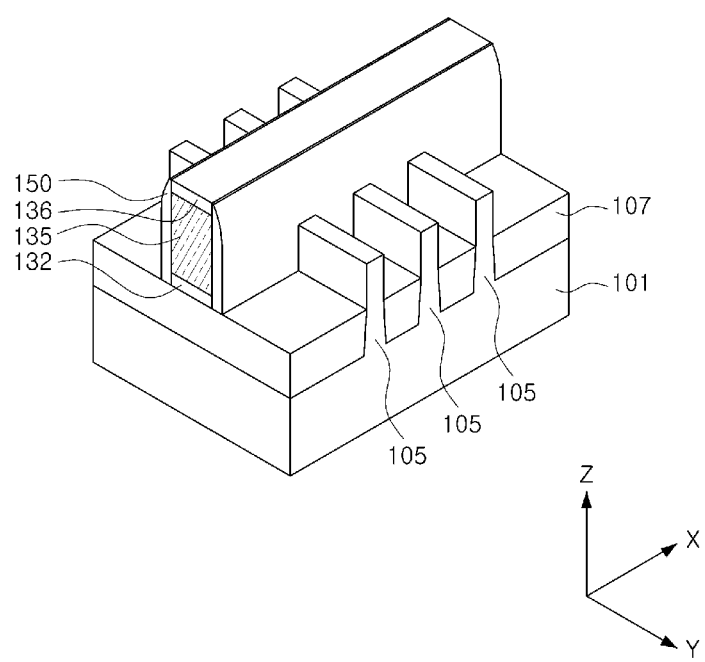

Referring to FIG. 5, a dummy gate insulating layer 132, a dummy gate electrode 135, and the spacers 150 that intersect with and extend from the active fins 105, may be formed.

The dummy gate insulating layer 132 and the dummy gate electrode 135 may be formed by, for example, performing an etching process using a mask pattern layer 136.

The dummy gate insulating layer 132 and the dummy gate electrode 135 may be formed in a region for the formation of the gate insulating layer 142 and the first and second gate electrodes 145 and 147 (refer to FIG. 1), and may be removed during a subsequent process. For example, the dummy gate insulating layer 132 may contain silicon oxide, and the dummy gate electrode 135 may contain polysilicon.

The spacers 150 may be formed by forming layers having a uniform thickness on the dummy gate insulating layer 132, the dummy gate electrode 135, and the mask pattern layer 136, and then performing anisotropic etching thereon. The spacers 150 may have a structure in which a plurality of layers is stacked.

Figure 6:
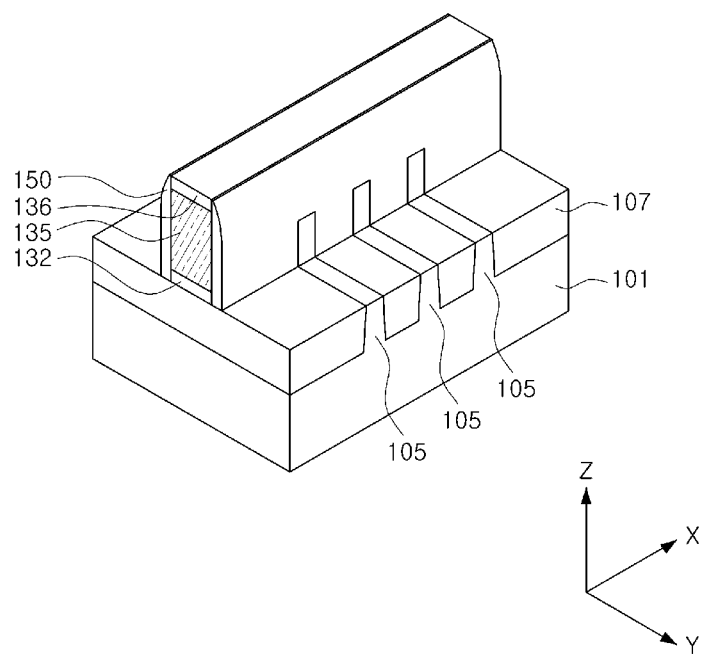

Referring to FIG. 6, the active fins 105 may be selectively removed from both sides of the spacers 150.

Recesses may be formed by removing the active fins 105 from both sides of the spacer 150. The recesses may be formed by partially etching the active fins 105 using the mask pattern layer 136 and the spacers 150 as a mask or after forming a separate mask layer. The recesses may be formed by sequentially applying a dry etching process and a wet etching process. Selectively, after the forming of the recesses, a process of curing surfaces of the recessed active fins 105 through a separate process may also be performed. In the example embodiment, upper surfaces of the recessed active fins 105 may be on the same level as the upper surfaces of the device isolation layers 107, but are not limited thereto. In another embodiment, the upper surfaces of the recessed active fins 105 may be higher or lower than the upper surfaces of the device isolation layers 107.

Prior to or after the forming of the recesses, a process of implanting an impurity (dopant) into the active fins 105 on both sides of the dummy gate electrode 135 may be performed. The process of implanting an impurity (dopant) may be performed using the mask pattern layer 136 and the spacers 150.

Figure 7:
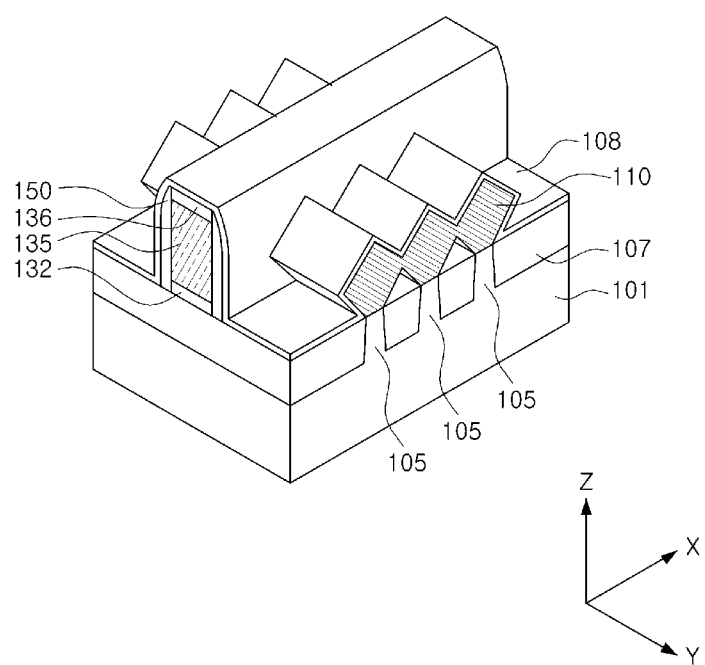

Referring to FIG. 7, after the source/drain regions 110 may be formed on the active fins 105, the etch stop layer 108 may be formed on an upper surface of the mask pattern layer 136, the side surfaces of the spacers 150, exposed surfaces of the source/drain regions 110, and exposed upper surfaces of the device isolation layers 107.

When the semiconductor device 100 is a PMOS, the source/drain regions 110 may be formed of silicon germanium (SiGe). The buffer region may be formed on the active fins 105 and the growth region grown from the buffer region may be formed, whereby the source/drain regions 110 may be formed. The growth region may be grown along a crystallographically stable surface during a growth process and may have a pentagonal shape or a hexagonal shape as illustrated in the embodiment. Thus, a surface of the growth region may have an angle of inclination with respect to the upper surface of the substrate 101. In this manner, when the surface of the growth region is grown as a crystallographically stable surface, the growth of the growth region may rarely occur, even in the case of an increase in growth time, after the growth region has been grown to have a predetermined size. The growth region may contain germanium (Ge) at a concentration higher than that of the buffer region. In addition, the growth region may contain a doping element, such as boron (B) at a concentration higher than that of the buffer region, but is not limited thereto.

When the semiconductor device 100 is a NMOS, the source/drain regions 110 may be formed of silicon (Si). The source/drain regions 110 may be grown on the active fins 105 without a separate buffer region.

Thereafter, the etch stop layer 108 may be deposited on the upper surface of the mask pattern layer 136, the side surfaces of the spacers 150, the surfaces of the source/drain regions 110, and the upper surfaces of the device isolation layers 107. The deposition of the etch stop layer 108 may be performed by a chemical vapor deposition (CVD) or an atomic layer deposition (ALD).

Figure 8:
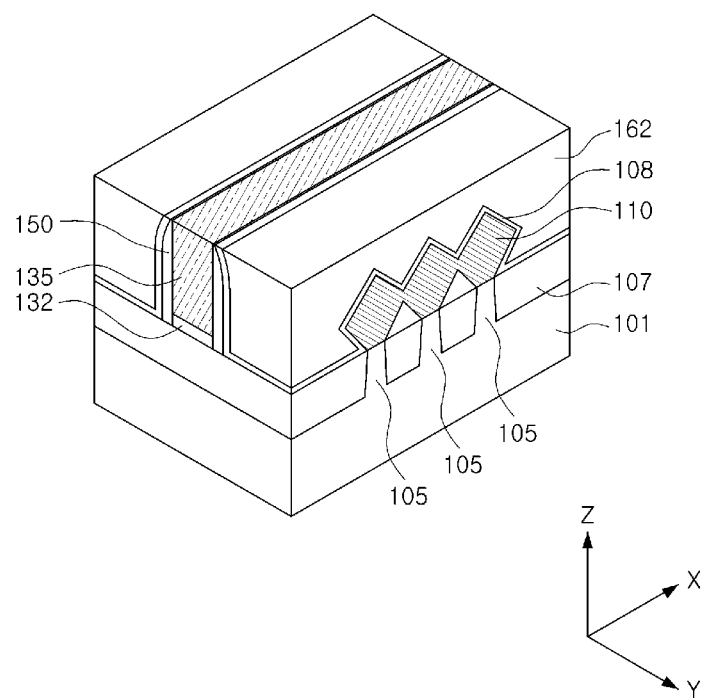

Referring to FIG. 8, the first interlayer dielectric layer 162 may be formed on the source/drain regions 110.

The first interlayer dielectric layer 162 may be formed by forming a layer covering the etch stop layer 108 using an insulating material and then exposing the upper surface of the dummy gate electrode 135 through a planarization process. Thus, in the process, the mask pattern layer 136 may be removed.

Figure 9:
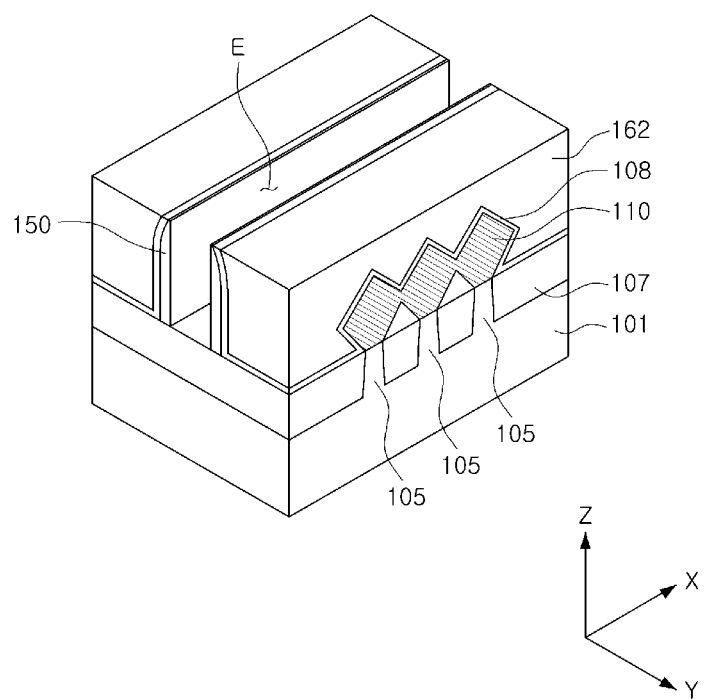

Referring to FIG. 9, the dummy gate insulating layer 132 and the dummy gate electrode 135 may be removed.

The dummy gate insulating layer 132 and the dummy gate electrode 135 may be selectively removed with respect to the device isolation layers 107, the active fins 105, and the spacers 150 to thereby form an opening E exposing the device isolation layers 107 and the active fins 105.

The removal process of the dummy gate insulating layer 132 and the dummy gate electrode 135 may be performed by at least one of a dry etching process and a wet etching process.

Figure 10:
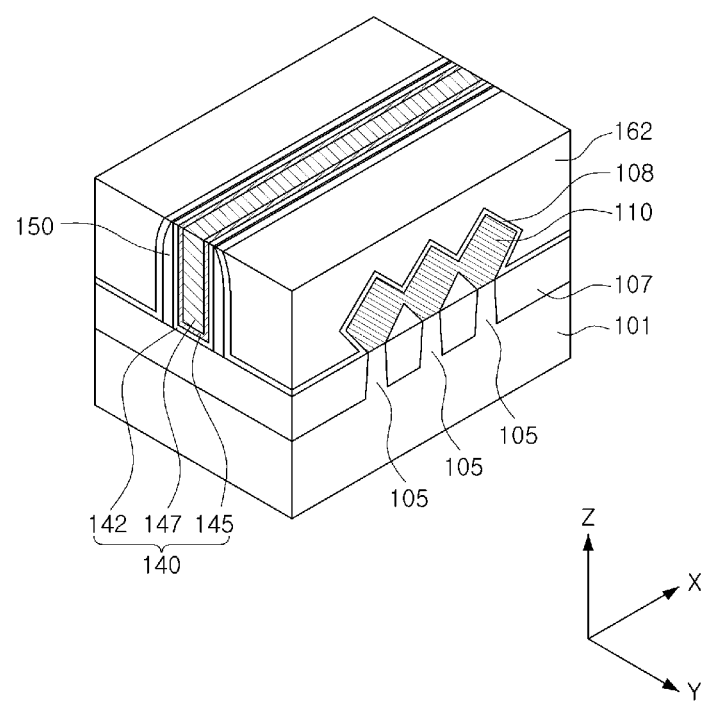

Referring to FIG. 10, the gate insulating layer 142 and the first and second gate electrodes 145 and 147 may be formed within the opening E (refer to FIG. 9) to form the gate structure 140.

The gate insulating layer 142 may be substantially conformally formed along side walls and a lower surface of the opening E (refer to FIG. 9). The gate insulating layer 142 may contain an oxide, a nitride, or a high-k dielectric material.

The first and second gate electrodes 145 and 147 may contain a metal or a semiconductor material.

Figure 11A:
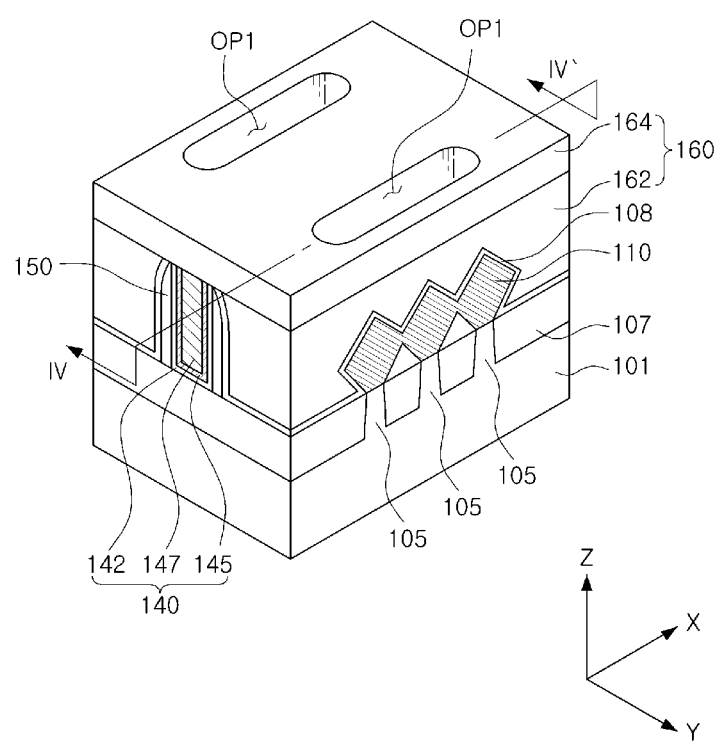
Figure 11B:
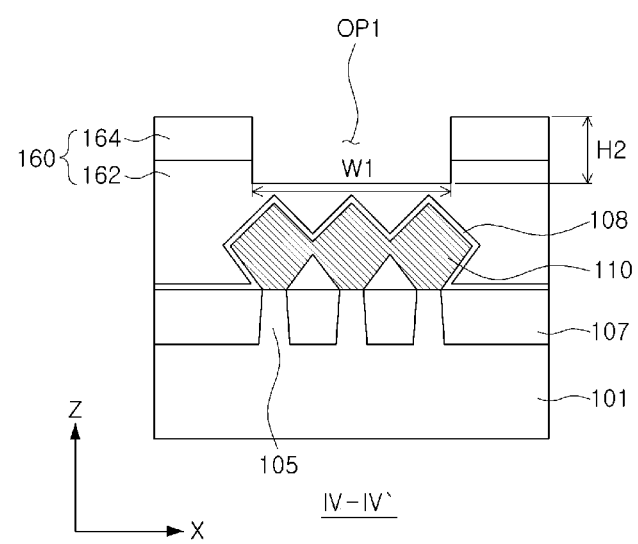

Referring to FIG. 11a and FIG. 11b, FIG. 11b is a cross-sectional view taken along line IV-IV' in a perspective view of FIG. 11a.

In the process, the interlayer dielectric layers 162 and 164 may be patterned to form an opening OP1.

The interlayer dielectric layer 160 may be partially removed from a region for the formation of the contact plug 180 (refer to FIG. 1) using a separate mask pattern layer, such as a photoresist pattern to thereby form a first opening OP1.

The first opening OP1 may have a predetermined depth H2 allowing the etch stop layer 108 covering the source/drain regions 110 not to be exposed outwardly. When the direction in which the gate structure 140 extends is the X-direction, the first opening OP1 may have a width W1 less than a length of a straight line connecting both ends of the source/drain regions 110 in the X-direction.

The first opening OP1 may be formed by an anisotropic etching process. The anisotropic etching process may be performed by a dry etching process.

Figure 12:
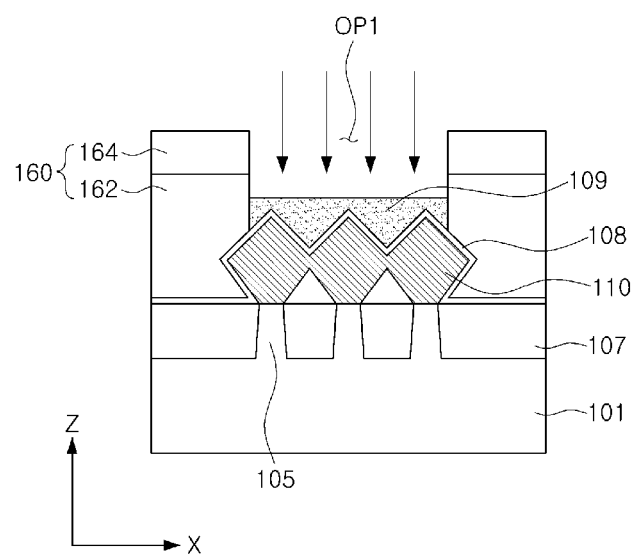

Referring to FIG. 12, impurity ions may be implanted through the first opening OP1 to form an impurity region 109.

A method of implanting the impurity ions may be performed by, for example, ion implantation or plasma doping. By implanting the impurity ions, when the interlayer dielectric layer 160 is partially removed through an isotropic etching process in a subsequent process, an etch rate of the impurity region 109 may be higher than an etch rate of the remaining interlayer dielectric layer 160.

The impurity ions are not limited as being implanted into the impurity region 109 as illustrated in FIG. 12. For example, the impurity ions may pass through the impurity region 109 and may be implanted into portions of the source/drain regions 110 and the etch stop layer 108.

The impurity ions may contain at least one of boron trifluoride ($BF_3$), boron (B), carbon (C), nitrogen (N), oxygen (O), fluorine (F), silicon (Si), germanium (Ge), arsenic (As), phosphorus (P), argon (Ar), gallium (Ga), or hydrogen (H).

For example, when the semiconductor device 100 (refer to FIG. 1) is a PMOS transistor and the impurity ions are p-type dopant ions, the impurity ions may be implanted into the source/drain regions 110 to reduce contact resistance of the source/drain regions 110. For example, when the semiconductor device 100 (refer to FIG. 1) is an NMOS transistor and the impurity ions are n-type dopant ions, the impurity ions may be implanted into the source/drain regions 110 to reduce contact resistance of the source/drain regions 110.

Figure 13:
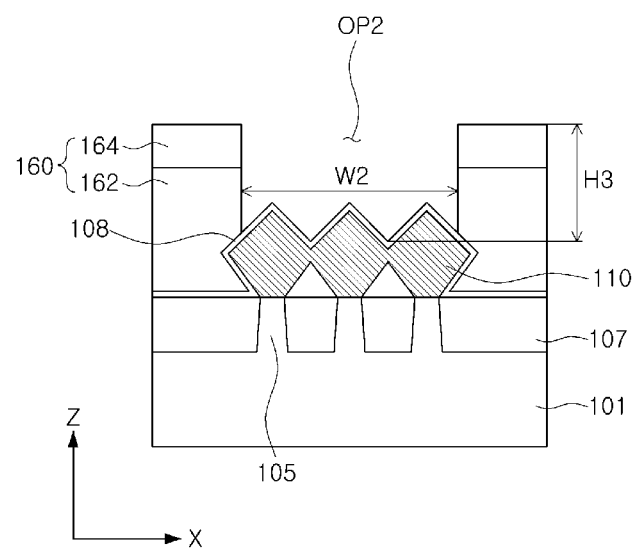

Referring to FIG. 13, the interlayer dielectric layer 160 including the impurity region 109 (refer to FIG. 12) may be partially removed to expose the etch stop layer 108 to thereby form a second opening OP2.

The second opening OP2 may have a width W2 less than the length of the straight line connecting both ends of the source/drain regions 110 in the X-direction. The second opening OP2 may have a depth H3 from an upper surface of the second interlayer dielectric layer 164 to a connection region of the source/drain regions 110 in the Z-direction.

The second opening OP2 may be formed by an isotropic etching process. The isotropic etching process may be performed by a wet etching process, and, for example, may be performed using an acid solution as an etchant. For example, the acid solution may be a diluted HF solution or a buffered oxide etchant (BOE).

When the second opening OP2 is formed by an isotropic etching process, because an etch rate of the impurity region 109 (refer to FIG. 12) may be greater than an etch rate of the remaining interlayer dielectric layer 160. The impurity region 109 may be efficiently removed without an excessive increase in the width W2 of the second opening. Therefore, a difference between the width W2 of the second opening OP2 and the width W1 of the first opening OP1 (refer to FIG. 12b) may be less than a difference between the depth H3 of the second opening OP2 and the depth H2 of the first opening OP1 (refer to FIG. 12b).

Figure 14:
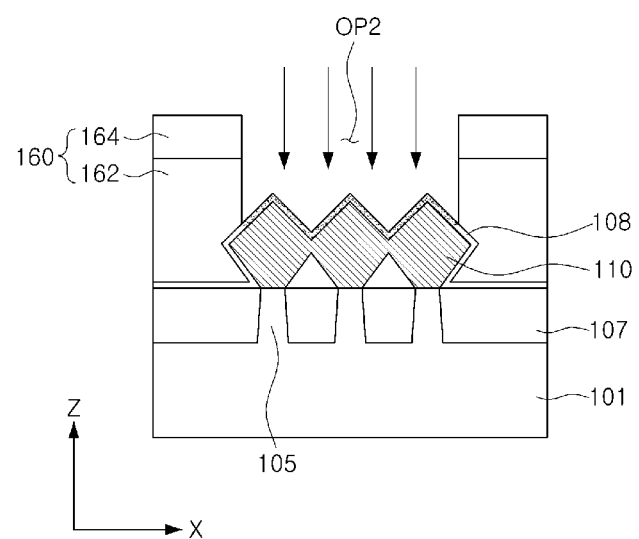

Referring to FIG. 14, impurity ions may be implanted into the etch stop layer 108 through the second opening OP2. The impurity ions may be uniformly implanted into the etch stop layer 108 to increase an etch rate of the etch stop layer 108 when the etch stop layer 108 is later removed. The impurity ions may not be present in only the etch stop layer 108 and may pass through the etch stop layer 108 to be implanted into portions of the source/drain regions 110.

A method of implanting the impurity ions may be identical to the method of implanting the impurity ions described with reference to FIG. 12. That is, the impurity ions may be implanted through ion implantation or plasma doping. The impurity ions may be identical to those described with reference to FIG. 12.

Figure 15:
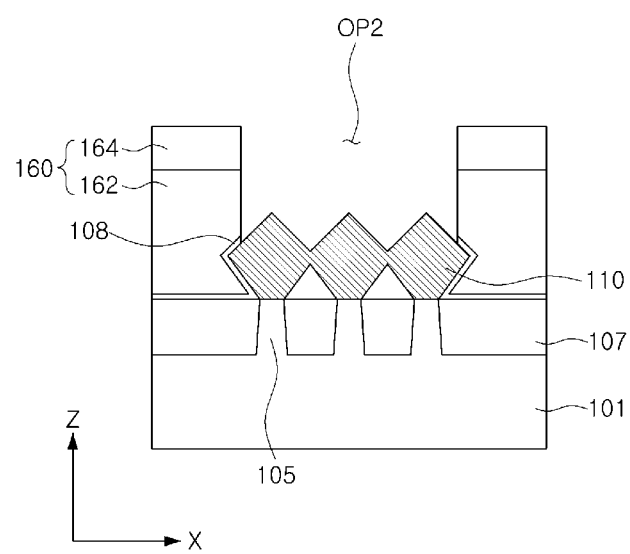

Referring to FIG. 15, the etch stop layer 108 exposed through the second opening OP2 may be removed.

A method of removing the etch stop layer 108 exposed through the second opening OP2 may be performed by a dry etching process.

The etch stop layer 108 may be removed by, for example, a SiCoNi™ method of using a remote plasma system (RPS) and using an ammonia (NH$_3$) gas and a nitrogen trifluoride (NF$_3$) gas, as an isotropic dry etching process.

In another embodiment, the etch stop layer 108 (refer to FIG. 14) may be removed by, for example, a soft etch process as an anisotropic dry etching process. The soft etch process may be performed using an etching gas including Cl$_2$, CHF$_3$, CF$_4$, or combinations thereof and an Ar and/or O$_2$ gas. In the exemplary embodiment, etch selectivity with respect to the etch stop layer 108 formed of a silicon nitride and the source/drain regions 110 formed of silicon or silicon germanium may be low.

The following Table 1 shows a result obtained by comparing etching removal rates of a silicon nitride into which impurity ions (BF$_3$ or B) were implanted and a silicon nitride into which the impurity ions were not implanted in the case of removing the silicon nitrides through a dry etching process under the same environmental and time conditions.

The etching removal rates may be calculated by the following formula 1.

Etching Removal Rate (%)=(Thickness of Layer prior to Etching−Thickness of Layer after Etching)/Thickness of Layer prior to Etching×100  [Formula 1]

TABLE 1

| | Etching Removal Rate (%) | |
|---|---|---|
| SiCoNi ™ Process | A silicon nitride plasma-doped with BF$_3$ 72.2 | A silicon nitride 5.6 |
| Soft etch Process | A silicon nitride plasma-doped with B 42.9 | A silicon nitride 11.4 |

The results of Table 1 show that when the silicon nitrides were etched through the SiCoNi™ process or the soft etch process, etch rates of the silicon nitrides were increased in the case of plasma-doping BF$_3$ or B.

Therefore, through the implantation of impurity ions, because the etch rate of the etch stop layer 108 (refer to FIG. 14) may be increased when a dry etching process is performed, the etch stop layer 108 (refer to FIG. 14) may be removed without excessive etching of the source/drain regions 110. Because a loss amount of upper portions of the source/drain regions 110 due to the etching may be reduced, the upper portions of the source/drain regions 110 may be maintained to be corrugated, and thus a wide contact area between the source/drain regions 110 and the contact plug 180 may be maintained.

In the case of removing the etch stop layer 108 (refer to FIG. 14) by the method as described above, a separate cleaning process (for example, an RF cleaning process) for forming the first conductive layer 182 (refer to FIG. 16) on the second opening OP2 may not be required.

Figure 16:
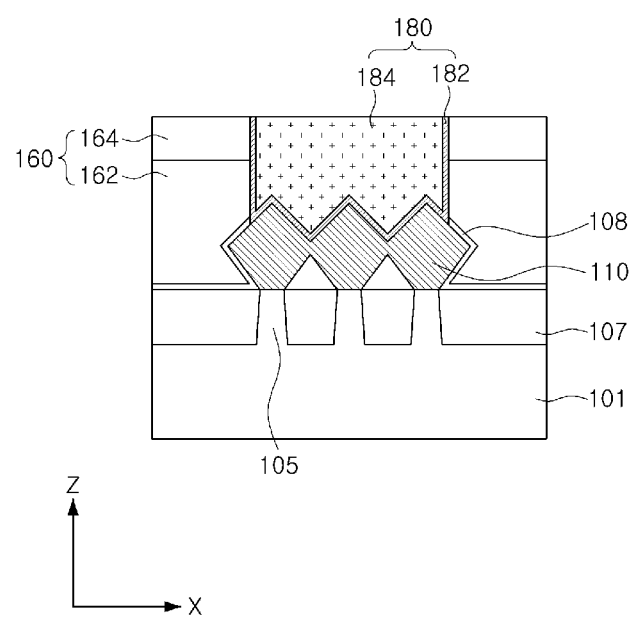

Referring to FIG. 16, the first conductive layer 182 and the second conductive layer 184 may be sequentially formed within the second opening OP2 (refer to FIG. 15).

The first conductive layer 182 may be formed along the upper portions of the exposed source/drain regions 110 and the sidewalls of the contact plugs 180, and may serve as a diffusion barrier layer for a metal material forming the second conductive layer 184. The second conductive layer 184 may be formed on the first conductive layer 182 to fill the second opening OP2. A portion of the source/drain regions 110 contacting the first conductive layer 182 may be silicidized to form the silicide layer 114 (refer to FIG. 2a).

Depending on embodiments, an ion implantation process may be performed to reduce contact resistance before the forming of the first conductive layer 182. When the semiconductor device 100 (refer to FIG. 1) is a PMOS, the source/drain regions 110 may be formed of, for example, silicon germanium (SiGe), and the impurity ions implanted through the ion implantation process may contain at least one of boron (B) or boron trifluoride (BF$_3$). When the semiconductor device 100 (refer to FIG. 1) is an NMOS, the source/drain regions 110 may be formed of, for example, silicon (Si), and the implanted impurity ions may contain at least one ion of phosphorus (P) or arsenic (As).

In an example embodiment, in the method of manufacturing the semiconductor device 100 illustrated in FIG. 3 through FIG. 16, processes illustrated in FIG. 11a through FIG. 12 may be omitted, and a process illustrated in FIG. 13 may be performed directly after a process illustrated in FIG. 10 has been performed.

In other words, after the process illustrated in FIG. 10, impurity ions may not be implanted through the formation of the first opening OP1 (refer to FIG. 11a), and the impurity ions may be implanted into the etch stop layer 108 (refer to FIG. 13) exposed after the second opening OP2 (refer to FIG. 13) is formed by partially removing the interlayer dielectric layer 160 (refer to FIG. 11a) so as to directly expose the etch stop layer 108 (refer to FIG. 13).

Figure 17:
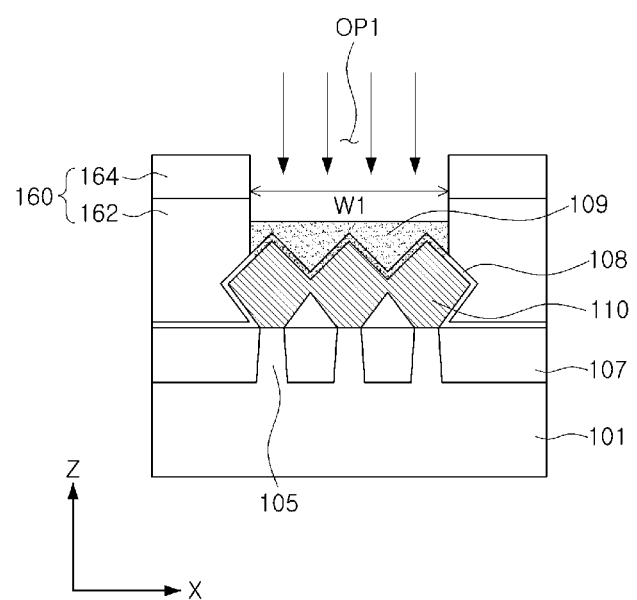
FIG. 17 through FIG. 18 are cross-sectional views illustrating respective processes of a method of manufacturing a semiconductor device according to an example embodiment of the present inventive concept.
Figure 18:
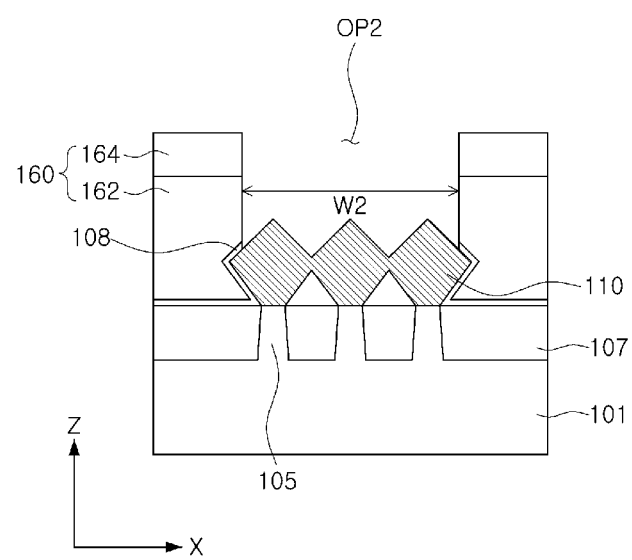

FIG. 17 through FIG. 18 are views illustrating a method of manufacturing a semiconductor device in a process sequence according to an example embodiment of the present inventive concept. FIG. 17 through FIG. 18 are cross-sectional views illustrating respective processes, taken along line I-I' of FIG. 2.

Processes of FIG. 17 through FIG. 18 illustrate a portion of the method of manufacturing the semiconductor device 100 illustrated in FIG. 1 through FIG. 2b. The processes of FIG. 3 through FIG. 11b may be performed prior to the process of FIG. 17.

Referring to FIG. 17, impurity ions may be implanted into the impurity region 109 and the etch stop layer 108 through the first opening OP1.

As the impurity ions are implanted up to the etch stop layer 108, it is unnecessary to add a separate method of implanting the impurity ions for removing the etch stop layer 108 in a subsequent process The method of implanting the impurity ions may be identical to the method of implanting the impurity ions described with reference to FIG. 12. The impurity ions may be identical to those described with reference to FIG. 12.

Referring to FIG. 18, after the second opening OP2 may be formed by partially removing the interlayer dielectric layer 160 including the impurity region 109 (refer to FIG. 17) so as to expose the etch stop layer 108, the etch stop layer 108 exposed by the second opening OP2 may be removed.

A method of forming the second opening OP2 may be identical to the method of forming the second opening OP2 described with reference to FIG. 13, and a method of removing the etch stop layer 108 may be identical to the method of removing the etch stop layer 108 described with reference to FIG. 15.

After the process illustrated in FIG. 18, a process identical to that illustrated in FIG. 16 may be performed, such that the semiconductor device 100 illustrated in FIG. 1 through FIG. 2b may be manufactured.

Figure 19:
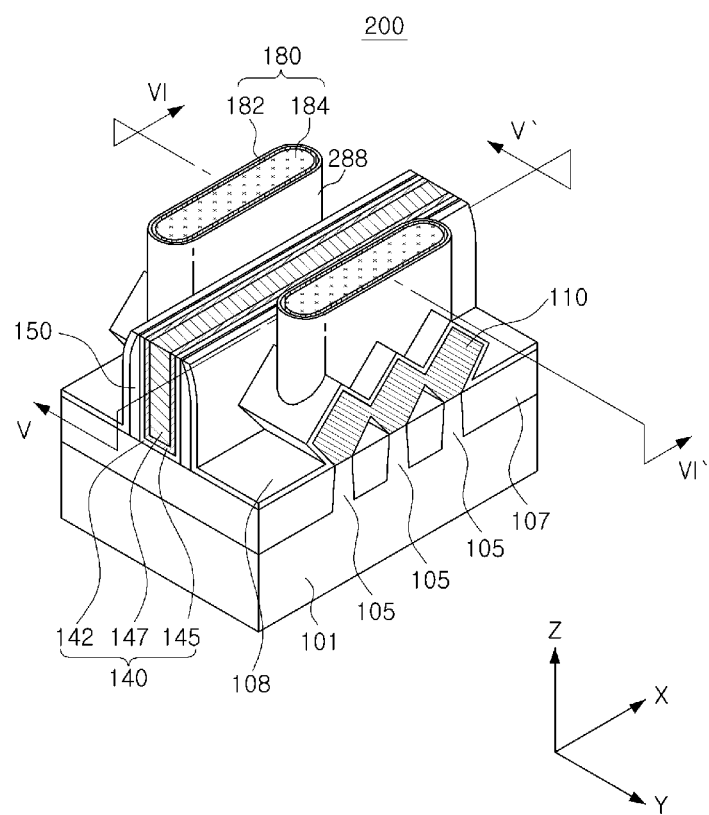
FIG. 19 is a perspective view of a semiconductor device according to an example embodiment of the present inventive concept.
Figure 20A:
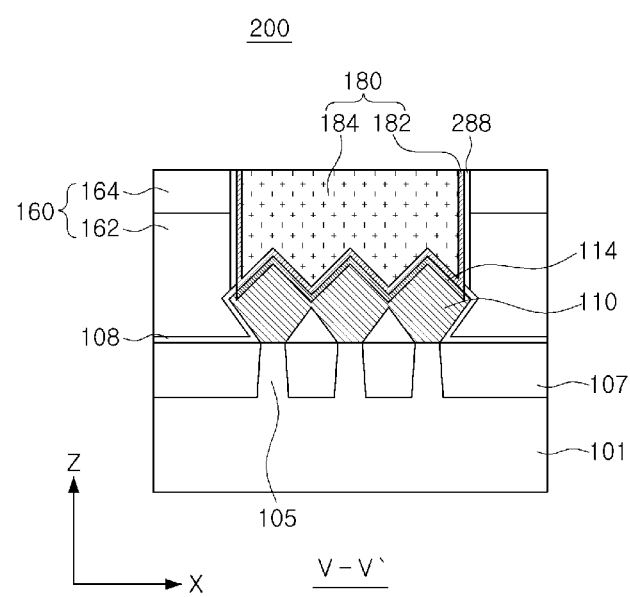
FIG. 20a and FIG. 20b are cross-sectional views of the semiconductor device of FIG. 19, taken along line V-V' and line VI-VI'.
Figure 20B:
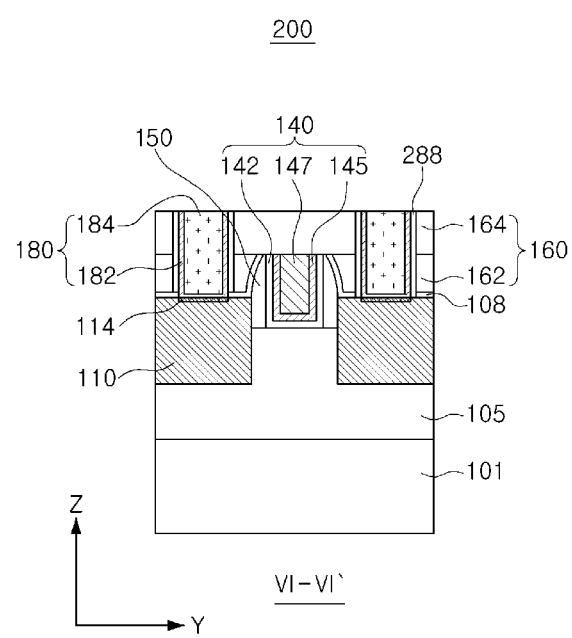

FIG. 19 is a perspective view of a semiconductor device according to an example embodiment of the present inventive concept. FIG. 20a and FIG. 20b are cross-sectional views of a semiconductor device 200 of FIG. 19 taken along line V-V' and line VI-VI'. For convenience of explanation, FIG. 19 illustrates only main components, for example, the interlayer dielectric layer 160 of FIG. 20a and FIG. 20b is omitted in FIG. 19.

Referring to FIG. 19 through FIG. 20b, the semiconductor device 200 may include the substrate 101, the active fins 105, the source/drain regions 110, the gate structure 140, and the contact plugs 180. The semiconductor device 200 may further include the device isolation layers 107, the spacer 150, the etch stop layer 108, and the interlayer dielectric layer 160. A contact plug insulating layer 288 may be disposed on a side surface of the contact plug 180.

The semiconductor device 200 according to the example embodiment may be a FinFET, which is a field effect transistor in which the active fins 105 respectively have a fin structure.

The contact plug insulating layer 288 disposed on the side surface of the contact plug 180 may reduce or prevent defects in which the interlayer dielectric layer 160 or the spacer 150 may be damaged during a manufacturing process and, thus, the contact plug 180 comes into contact with the gate structure 140 to be electrically shorted. The contact plug insulating layer 288 may be formed of, for example, a silicon nitride.

FIG. 21 through FIG. 24 are cross-sectional views illustrating respective processes of a method of manufacturing a semiconductor device according to another example embodiment of the present inventive concept. FIG. 21 through FIG. 24 are cross-sectional views illustrating respective processes taken along line V-V' illustrated in FIG. 19.

The processes illustrated in FIG. 21 through FIG. 24 show a portion of the method of manufacturing the semiconductor device 200 illustrated in FIG. 19 through FIG. 20b. The processes illustrated in FIG. 3 through FIG. 13 may be performed prior to the process of FIG. 21.

Figure 21:
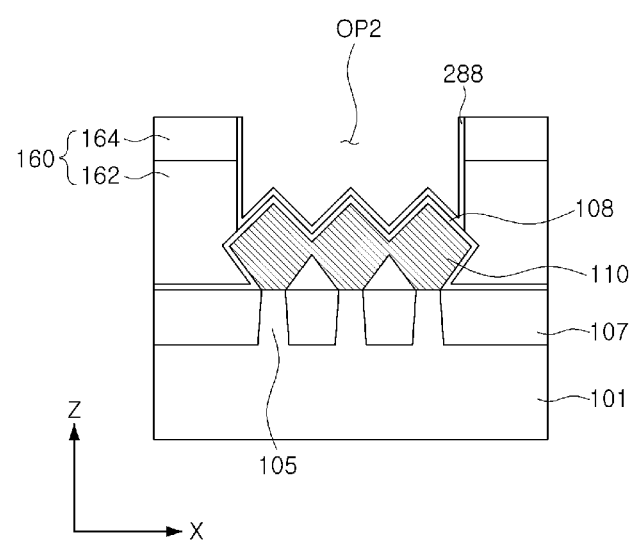
FIG. 21 through FIG. 24 are cross-sectional views illustrating respective processes of a method of manufacturing a semiconductor device according to an example embodiment of the present inventive concept.

Referring to FIG. 21, the contact plug insulating layer 288 may be formed to cover the side surface of the second opening OP2 and an exposed upper surface of the etch stop layer 108.

The contact plug insulating layer 288 may be formed of, for example, a silicon nitride, to prevent or reduce the likelihood of the contact plug 180 (refer to FIG. 19) and the gate structure 140 (refer to FIG. 19) from being electrically shorted to each other.

Figure 22:
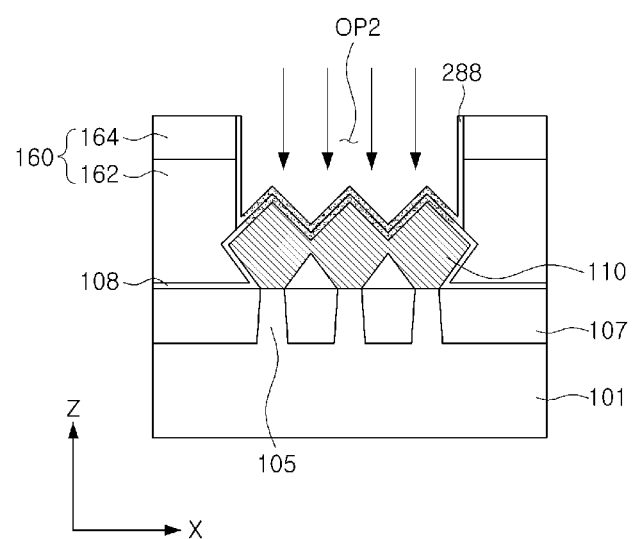

Referring to FIG. 22, impurity ions may be implanted into the etch stop layer 108 and the contact plug insulating layer 288 through the second opening OP2.

The impurity ions may pass through the contact plug insulating layer 288 to be implanted up to the etch stop layer 108, whereby etch rates of the contact plug insulating layer 288 and the etch stop layer 108 into which the impurity ions have been implanted may be increased. The impurity ions may pass through the etch stop layer 108 to be implanted up to a portion of the source/drain regions 110.

The method of implanting the impurity ions may be identical to the method of implanting the impurity ions described with reference to FIG. 12. The impurity ions may be identical to those described with reference to FIG. 12.

Figure 23:
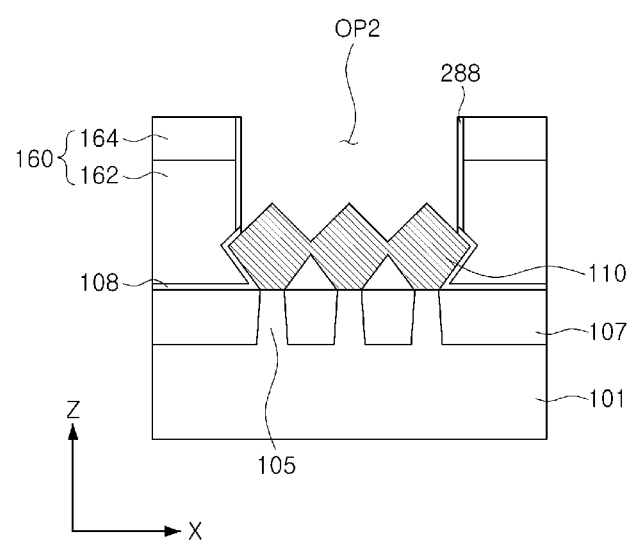

Referring to FIG. 23, the contact plug insulating layer 288 and the etch stop layer 108 into which the impurity ions have been implanted may be removed.

The removal method may be identical to the method of removing the etch stop layer 108 described with reference to FIG. 15. In the process of FIG. 22, the impurity ions may be implanted to increase the etch rates of the contact plug insulating layer 288 and the etch stop layer 108 in the case of performing a dry etching process, such that the contact plug insulating layer 288 and the etch stop layer 108 into which the impurity ions have been implanted may be removed without excessive etching of the source/drain regions 110. Because a loss amount of upper portions of the source/drain regions 110 due to the etching may be reduced, the upper portions of the source/drain regions 110 may be maintained to be corrugated and, thus, a wide contact area between the source/drain regions 110 and the contact plug 180 may be maintained.

Figure 24:
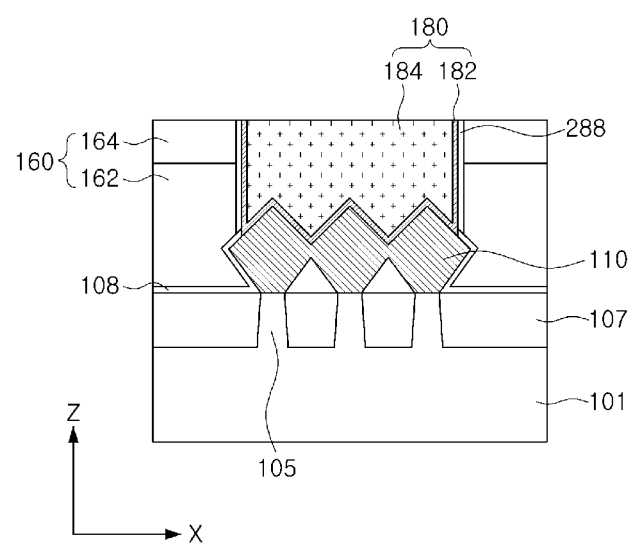

Referring to FIG. 24, the first conductive layer 182 and the second conductive layer 184 may be sequentially formed within the second opening OP2 (refer to FIG. 23).

The first conductive layer 182 may be formed along the upper portions of the exposed source/drain regions 110 and the side surface of the contact plug insulating layer 288, and may serve as a diffusion barrier layer for a metal material forming the second conductive layer 184. The second conductive layer 184 may be formed on the first conductive layer 182 to fill the second opening OP2. A portion of the source/drain regions 110 contacting the first conductive layer 182 may be silicidized to form the silicide layer 114 (refer to FIG. 20a).

Depending on embodiments, an ion implantation process may be performed to reduce contact resistance before the forming of the first conductive layer 182. When the semiconductor device 200 (refer to FIG. 19) is a PMOS, the source/drain regions 110 may be formed of, for example, silicon germanium (SiGe), and the impurity ions implanted through the ion implantation process may contain at least one of boron (B) or boron trifluoride ($BF_3$). When the semiconductor device 200 (refer to FIG. 19) is an NMOS, the source/drain regions 110 may be formed of, for example, silicon (Si), and the implanted impurity ions may contain at least one ion of phosphorus (P) or arsenic (As).

Figure 25:
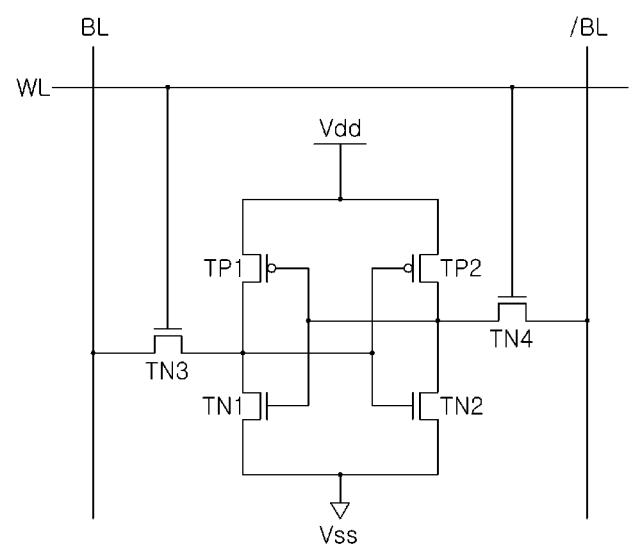
FIG. 25 is a circuit diagram of a SRAM cell including a semiconductor device according to an example embodiment of the present inventive concept.

FIG. 25 is a circuit diagram of an SRAM cell including a semiconductor device according to an example embodiment of the present inventive concept.

Referring to FIG. 25, in an SRAM device, a single SRAM cell may be configured of first and second driving transistors TN1 and TN2, first and second load transistors TP1 and TP2, and first and second access transistors TN3 and TN4. In this case, sources of the first and second driving transistors TN1 and TN2 may be connected to a ground voltage line Vss, and sources of the first and second load transistors TP1 and TP may be connected to a power voltage line Vdd.

The first driving transistor TN1 formed of an NMOS transistor and the first load transistor TP1 formed of a PMOS transistor may be configured as a first inverter, and the second driving transistor TN2 formed of an NMOS transistor and the second load transistor TP2 formed of a PMOS transistor may be configured as a second inverter. At least one of the first and second driving transistors TN1 and TN2, the first and second load transistors TP1 and TP2, and the first and second access transistors TN3 and TN4 may include the semiconductor devices according to various example embodiments of the present inventive concept described with reference to FIG. 1 and FIG. 19. In particular, the first and second load transistors TP1 and TP2 formed of PMOS transistors may be formed of the semiconductor devices according to the example embodiments of the present inventive concept.

Output terminals of the first and second inverters may be connected to sources of the first and second access transistors TN3 and TN4. In addition, input and output terminals of the first and second inverters may intersect with each other and be connected to each other. In addition, drains of the first and second access transistors TN3 and TN4 may be connected to first and second bit lines BL and /BL, respectively.

Figure 26:
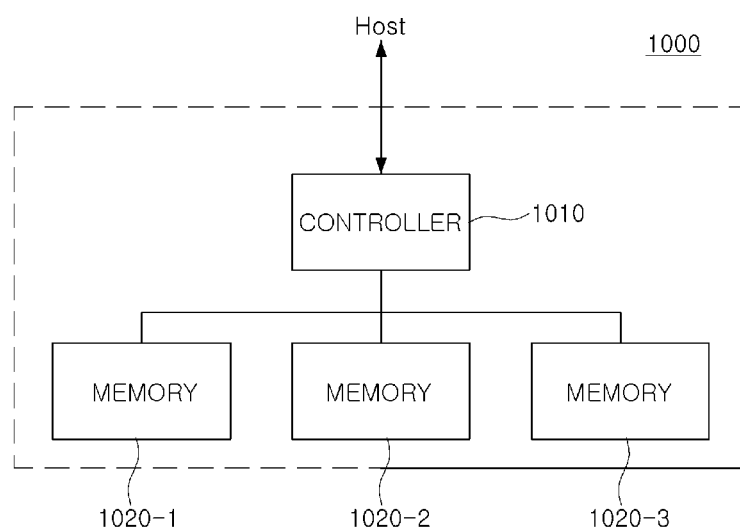
FIG. 26 is a block diagram of a storage apparatus including a semiconductor device according to an example embodiment of the present inventive concept.

FIG. 26 is a block diagram of a storage apparatus including a semiconductor device according to an example embodiment of the present inventive concept.

Referring to FIG. 26, a storage apparatus 1000 according to the example embodiment of the present inventive concept may include a controller 1010 communicating with a host, and memories 1020-1, 1020-2, and 1020-3 configured to store data. The respective memories 1020-1, 1020-2, and 1020-3 may include the semiconductor devices according to various example embodiments of the present inventive concept described with reference to FIG. 1 and FIG. 19.

Examples of the host communicating with the controller 1010 may include various electronic devices on which the storage apparatus 1000 is mounted. For example, the host may be a smartphone, a digital camera, a desktop computer, a laptop computer, a portable media player, or the like. The controller 1010 may receive a data writing or reading request transferred from the host to store data in the memories 1020-1, 1020-2, and 1020-3 or generate a command (CMD) for retrieving data from the memories 1020-1, 1020-2, and 1020-3.

As illustrated in FIG. 26, at least one or more memories 1020-1, 1020-2, and 1020-3 may be connected to the controller 1010 in parallel in the storage apparatus 1000. The plurality of memories 1020-1, 1020-2, and 1020-3 may be connected to the controller 1010 in parallel, whereby the storage apparatus 1000 having high capacity, such as a solid state drive may be implemented.

Figure 27:
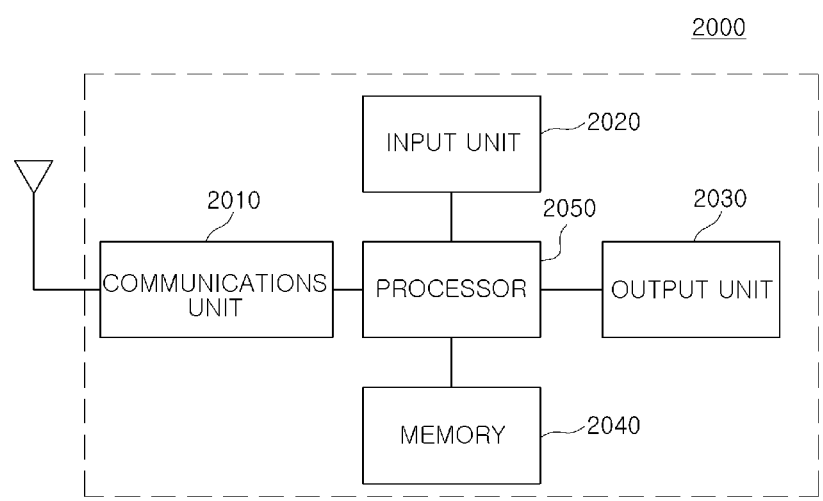
FIG. 27 is a block diagram of an electronic apparatus including a semiconductor device according to an example embodiment of the present inventive concept.

FIG. 27 is a block diagram of an electronic apparatus including a semiconductor device according to an example embodiment of the present inventive concept.

Referring to FIG. 27, an electronic apparatus 2000 according to the example embodiment may include a communications unit 2010, an input unit 2020, an output unit 2030, a memory 2040, and a processor 2050.

The communications unit 2010 may include a wired or wireless communications module, a wireless Internet module, a local area communications module, a global positioning system (GPS) module, a mobile communications module, and the like. The wired or wireless communications module included in the communications unit 2010 may be connected to external communications networks according to various communications standard specifications to transmit and receive data.

The input unit 2020 may be a module provided to control an operation of the electronic apparatus 2000 by a user, and may include a mechanical switch, a touchscreen, a voice recognition module, and the like. In addition, the input unit 2020 may include a mouse operating in a track ball or a laser pointer scheme or a finger mouse device. In addition to these, the input unit 2020 may further include various sensor modules allowing for a user to input data thereto.

The output unit 2030 may output information processed in the electronic apparatus 2000 in a sound or image form, and the memory 2040 may store programs for the processing and the control of the processor 2050. The processor 2050 may transfer a command to the memory 2040 according to a required operation to thereby store or retrieve data.

The memory 2040 may be embedded in the electronic apparatus 2000 to communicate with the processor 2050 directly or communicate with the processor 2050 through a separate interface. In a case in which the memory 2040 communicates with the processor 2050 through a separate interface, the processor 2050 may store or retrieve data through various interface standards such as SD, SDHC, SDXC, MICRO SD, USB, and the like.

The processor 2050 may control operations of respective components included in the electronic apparatus 2000. The processor 2050 may perform control and processing in association with voice communications, video telephony, data communications, and the like, or may perform control and processing for multimedia reproduction and management. In addition, the processor 2050 may process an input transferred from a user through the input unit 2020, and may output results thereof through the output unit 2030. In addition, the processor 2050 may store data used in controlling the operation of the electronic apparatus 2000 as described above in the memory 2040, or fetch data from the memory 2040. At least one of the processor 2050 and the memory 2040 may include the semiconductor devices according to various example embodiments of the present inventive concept described with reference to FIG. 1 and FIG. 19.

Figure 28:
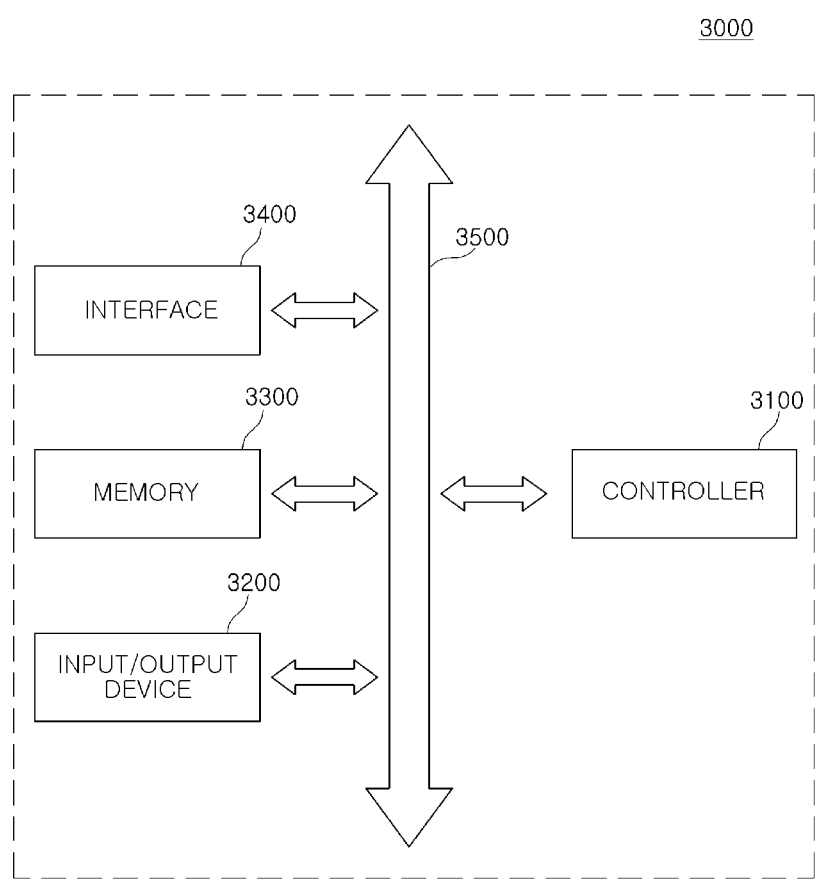
FIG. 28 is a schematic view of a system including a semiconductor device according to an example embodiment of the present inventive concept.

FIG. 28 is a schematic view of a system including a semiconductor device according to an example embodiment of the present inventive concept.

Referring to FIG. 28, a system 3000 may include a controller 3100, an input/output device 3200, a memory 3300, and an interface 3400. The system 3000 may transmit or receive mobile system or information. Examples of the mobile system may include PDAs, portable computers, web tablets, wireless phones, mobile phones, digital music players, and memory cards.

The controller 3100 may execute a program and control the system 3000. The controller 3100 may be a microprocessor, a digital signal processor, a microcontroller, or a device similar thereto.

The input/output device 3200 may be used to input or output data to or from the system 3000. The system 3000 may be connected to an external device, such as a personal computer or networks, and may exchange data with the external device. The input/output device 3200 may be a keypad, a keyboard, or a display device.

The memory 3300 may store a code and/or data for operating the controller 3100 and/or store data having been processed by the controller 3100. The memory 3300 may include the semiconductor device according to one of the example embodiments of the present inventive concept.

The interface 3400 may be a data transmission path between the system 3000 and an external device. The controller 3100, the input/output device 3200, the memory 3300, and the interface 3400 may be in communication with one another via a bus 3500.

At least one of the controller 3100 or the memory 3300 may include the semiconductor devices according to various example embodiments of the present inventive concept described with reference to FIG. 1 and FIG. 19.

As set forth above, according to example embodiments of the present inventive concept, a method of manufacturing a semiconductor device having increased degrees of integration and reliability by maintaining a wide contact area of the source/drain regions may be provided.

While example embodiments have been shown and described above, it will be apparent to those skilled in the art that modifications and variations could be made without departing from the scope of the invention as defined by the appended claims.

What is claimed is:

1. A method of manufacturing a semiconductor device, comprising:
   forming active fins on a substrate;
   forming source/drain regions on the active fins on both sides of a gate structure, the gate structure extending in a direction intersecting with a direction in which the active fins extend;
   forming an etch stop layer on the source/drain regions;
   forming an interlayer dielectric layer on the etch stop layer;
   forming a first opening by partially removing the interlayer dielectric layer so as not to expose the etch stop layer;
   forming an impurity region within the interlayer dielectric layer by implanting a first impurity ion through the first opening;
   forming a second opening by removing the impurity region so as to expose the etch stop layer;
   implanting a second impurity ion into the exposed etch stop layer; and
   removing the exposed etch stop layer.

2. The method of claim 1, wherein the first impurity ion is implanted into the etch stop layer.

3. The method of claim 1, wherein forming the second opening comprises forming the second opening using a wet etching process.

4. The method of claim 3, wherein an etch rate of the impurity region is greater than an etch rate of the interlayer dielectric layer.

5. The method of claim 3, wherein an acid solution is used as an etchant in the wet etching process.

6. The method of claim 1, wherein the second opening has a width smaller than a length of a straight line connecting both ends of the source/drain regions in the direction in which the gate electrode extends.

7. The method of claim 1, wherein upper surfaces of the source/drain regions have a corrugated shape, and
   maintaining the upper surfaces of the source/drain regions to have the corrugated shape after removal of the exposed etch stop layer.

8. The method of claim 1, wherein removing the exposed etch stop layer comprises removing the exposed etch stop layer using a dry etching process.

9. The method of claim 8, wherein the dry etching process is an anisotropic dry etching process.

10. The method of claim 9, wherein in the anisotropic dry etching process a gas comprising at least one of $Cl_2$, $CHF_3$, and $CF_4$ is used as an etching gas.

11. The method of claim 8, wherein the dry etching process is an isotropic dry etching process.

12. The method of claim 11, wherein in the isotropic dry etching process a gas comprising $NH_3$ and $NF_3$ gas is used as an etching gas.

13. The method of claim 1, wherein the first and second impurity ions contain at least one ion of $BF_3$, B, C, N, 0, F, Si, Ge, As, P, Ar, Ga, and H.

14. The method of claim 1, wherein at least one of the first and second impurity ions is implanted into a portion of the source/drain regions.

15. The method of claim 1, wherein the etch stop layer comprises silicon nitride.

16. The method of claim 1, further comprising:
   forming a contact plug insulating layer on a side surface of the second opening and the exposed etch stop layer;
   wherein the implanting a second impurity ion into the etch stop layer comprises implanting a second impurity ion into the etch stop layer and the contact plug insulating layer through the second opening, and
   wherein the removing the etch stop layer comprises removing the etch stop layer and the contact plug insulating layer into which the second impurity ion is implanted.

17. The method of claim 16, wherein each of the etch stop layer and the contact plug insulating layer comprise silicon nitride.

18. A method of manufacturing a semiconductor device, comprising:
   forming active fins on a substrate;
   forming source/drain regions on the active fins on both sides of a gate structure, the gate structure extending in a direction intersecting with a direction in which the active fins extend;
   forming an etch stop layer on the source/drain regions;
   forming an interlayer dielectric layer on the etch stop layer;
   forming a first opening by partially removing the interlayer dielectric layer so as not to expose the etch stop layer;
   implanting an impurity ion into the interlayer dielectric layer and the etch stop layer through the first opening; and
   removing the interlayer dielectric layer and the etch stop layer into which the impurity ion is implanted.

19. A method of manufacturing a semiconductor device, comprising:
   forming active fins on a substrate;
   forming source/drain regions on the active fins on both sides of a gate structure;
   forming an etch stop layer on the source/drain regions, the etch stop layer having a first etching removal rate;
   implanting impurity ions into the etch stop layer, the etch stop layer having the impurity ions having a second etching removal rate; and
   removing the etch stop layer.

20. The method of claim 19, wherein upper surfaces of the source/drain regions have a corrugated shape; and
   wherein the upper surfaces of the source/drain regions have the corrugated shape after removing the etch stop layer.

* * * * *